(12) United States Patent
Bang et al.

(10) Patent No.: US 11,608,470 B2
(45) Date of Patent: Mar. 21, 2023

(54) THERMALLY AND CHEMICALLY STABLE QUANTUM DOTS ENCAPSULATED WITH FUNCTIONAL POLYMERIC LIGANDS, METHOD FOR PREPARING THE ENCAPSULATED QUANTUM DOTS AND THERMALLY STABLE QUANTUM DOT OPTICAL FILM USING THE ENCAPSULATED QUANTUM DOTS

(71) Applicant: Korea University Research and Business Foundation, Seoul (KR)

(72) Inventors: Joona Bang, Seoul (KR); Jaewan Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 238 days.

(21) Appl. No.: 17/012,510

(22) Filed: Sep. 4, 2020

(65) Prior Publication Data

US 2021/0087466 A1    Mar. 25, 2021

(30) Foreign Application Priority Data

Sep. 25, 2019    (KR) ........................ 10-2019-0118128

(51) Int. Cl.
 *C09K 11/88* (2006.01)
 *H01L 51/50* (2006.01)
 (Continued)

(52) U.S. Cl.
 CPC ........ *C09K 11/883* (2013.01); *C08F 297/026* (2013.01); *C09K 11/025* (2013.01);
 (Continued)

(58) Field of Classification Search
 CPC ..... C09K 11/883; C09K 11/025; B82Y 20/00; B82Y 30/00; B82Y 40/00
 See application file for complete search history.

(56) References Cited

FOREIGN PATENT DOCUMENTS

KR    10-2011-0102998 A    9/2011
KR    10-2011-0106176 A    9/2011

OTHER PUBLICATIONS

Ko, Jaewan et al., "Thermally and Chemically Robust Colloidal Quantum Dots by Cross-Linkable Polymeric Ligands", Polymer Science and Technology vol. 30, No. 1, Feb. 2019.*

(Continued)

*Primary Examiner* — C Melissa Koslow
(74) *Attorney, Agent, or Firm* — NSIP Law

(57) ABSTRACT

The present invention relates to thermally and chemically stable quantum dots encapsulated with functional polymeric ligands, a thermally stable quantum dot optical film using the encapsulated quantum dots, and a method for preparing the encapsulated quantum dots. The coating of the surface of the quantum dots with the polymer stabilizes the quantum dots and improves the durability and dispersibility of the quantum dot optical film, achieving markedly improved efficiency of photoluminescent quantum dot devices. Therefore, it is anticipated that the present invention will pave the way for practical use of quantum dots in a variety of light-emitting applications, particularly in high power light-emitting sources, to find commercial application in various fields, including displays, bioimaging, lightings, and photovoltaic cells.

9 Claims, 27 Drawing Sheets

(51) Int. Cl.
*C08F 297/02* (2006.01)
*C09K 11/02* (2006.01)
*B82Y 40/00* (2011.01)
*B82Y 30/00* (2011.01)
*B82Y 20/00* (2011.01)

(52) U.S. Cl.
CPC ............ *H01L 51/502* (2013.01); *B82Y 20/00* (2013.01); *B82Y 30/00* (2013.01); *B82Y 40/00* (2013.01); *C08J 2333/12* (2013.01)

(56) References Cited

OTHER PUBLICATIONS

Ko et al., "Thermally and Chemically Stable Quantum Dots Prepared By Shell Encapsulation with Cross-linkable Block Copolymer Ligands", NPG Asia Materials, (2020), 12:19, pp. 1-11, Feb. 21, 2020.*
Chen, Lanlan, et al., "Synthesis of poly (n-butyl methacrylate)-(glycidyl methacrylate) block copolymer and its compatibilization at the interface of the QD/epoxy nanocomposite for white LED encapsulation," *RSC advances,* 5, 80, 2015 (pp. 65184-65191).
Ko, Jaewan et al., "Thermally and Chemically Robust Colloidal Quantum Dots by Cross-Linkable Polymeric Ligands", Polymer Science and Technology vol. 30, No. 1, Feb. 2019 (1 page in English).

* cited by examiner

THERMALLY AND CHEMICALLY STABLE QUANTUM DOTS ENCAPSULATED WITH FUNCTIONAL POLYMERIC LIGANDS, METHOD FOR PREPARING THE ENCAPSULATED QUANTUM DOTS AND THERMALLY STABLE QUANTUM DOT OPTICAL FILM USING THE ENCAPSULATED QUANTUM DOTS

CROSS-REFERENCE TO RELATED APPLICATIONS

A claim for priority under 35 U.S.C. § 119 is made to Korean Patent Application No. 10-2019-0118128 filed on Sep. 25, 2019, in the Korean Intellectual Property Office, the entire contents of which are hereby incorporated by reference.

BACKGROUND OF THE INVENTION

1. Field of the Invention

The present invention relates to thermally and chemically stable quantum dots encapsulated with functional polymeric ligands, a thermally stable quantum dot optical film using the encapsulated quantum dots, and a method for preparing the encapsulated quantum dots.

2. Description of the Related Art

Quantum dots (QDs) are nanocrystals composed of semiconductor compounds of Groups III-V or Groups II-VI of the Periodic Table and having a size of tens of nanometers or less. A myriad of academic research and industrial applications related to semiconductor nanocrystals has been conducted continuously. Particularly, quantum dots have an easily tunable emission wavelength due to the quantum confinement effect and exhibit outstanding color purity because of their relatively uniform size. Due to such advantages, quantum dots are widely used in various fields, including displays, bioimaging, lightings, and photovoltaic cells.

Despite these advantages, the surface of quantum dots is extremely vulnerable to external stimuli such as heat, oxidation, and moisture, resulting in deterioration of luminous efficiency. Low luminous efficiency is a significant obstacle to the use of quantum dots in a variety of applications. Further, surface oxidation of quantum dots leads to a considerable reduction in luminous efficiency or detachment of ligands causes poor process compatibility such as aggregation of quantum dots in solutions. Thus, continuous efforts have been made to find a solution to these problems.

In most cases, quantum dots dispersed, for example, in a resin or matrix, tend to aggregate in photoluminescent quantum dot films such as color filters because the surface properties of the quantum dots are different from the chemical properties of the resin. Particularly, energy transfer between densely packed quantum dots in quantum dot films is relatively prominent compared to that in solutions, and as a result, several performance characteristics (such as photoconversion efficiency) of quantum dot films are lower than expected.

As a solution to these problems, it is necessary to develop technology for enhancing the stability of quantum dots while controlling the surface properties of the quantum dots to improve the dispersibility of the quantum dots in photoluminescent quantum dot films.

In recent years, several encapsulation approaches have been reported for coating the surface of quantum dots with functional organic or inorganic materials to protect the surface of the quantum dots from the external environment and have attracted great attention in that the stability of quantum dots can be improved in a simple and economical manner. This surface encapsulation protects the surface of quantum dots from the external environment to suppress oxidation of the quantum dots, greatly contributing to the stability and durability of the quantum dots.

However, the conventional approaches still have a limitation in that the luminous efficiency of quantum dots deteriorates under harsh conditions for surface treatment and fail to freely control the surface properties of quantum dots, with the result that sufficient dispersibility of quantum dots in films is not achieved. Thus, the impediments to the application of quantum dots to quantum dot optical films need to be completely removed.

SUMMARY OF THE INVENTION

The present invention has been made in an effort to solve the above problems and intends to provide thermally and chemically stable core-shell structured quantum dots whose surface is encapsulated with functional polymeric ligands by surface treatment under mild conditions and a method for preparing the stable core-shell structured quantum dots.

The present invention also intends to provide a quantum dot-polymer composite optical film in which the stable core-shell structured quantum dots are uniformly dispersed.

According to one aspect of the present invention, thermally and chemically stable core-shell structured quantum dots include core-shell structured quantum dots and thiol-terminated cross-linkable polymeric ligands introduced on the surface of the core-shell structured quantum dots to encapsulate the surface of the core-shell structured quantum dots.

The cross-linkable polymeric ligand is a block copolymer consisting of a cross-linkable monomer block designed to form an inner shell surrounding the surface of the quantum dots and a general monomer block designed to form an outer brush for better dispersion in the resin.

According to one embodiment of the present invention, the cross-linkable polymeric ligand may be a block copolymer consisting of, as repeating units, methyl methacrylate forming an outer brush and glycidyl methacrylate forming an inner shell. That is, the block copolymer is poly(methyl methacrylate-b-glycidyl methacrylate).

That is, the core-shell structured quantum dots are encapsulated with two layers consisting of a polyglycidyl methacrylate inner shell and a polymethyl methacrylate outer brush.

The core of the quantum dots may be a binary compound selected from CdSe, CdTe, ZnS, ZnSe, ZnTe, ZnO, HgS, HgSe, HgTe, MgSe, and MgS or a binary compound selected from GaN, GaP, GaAs, GaSb, AlN, AlP, AlAs, AlSb, InN, InP, InAs, and InSb, and the shell of the quantum dots may be a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS.

According to one embodiment of the present invention, the quantum dots may have a CdSe/ZnCdS or InP/ZnSeS core/shell structure.

According to a further aspect of the present invention, a quantum dot-polymer composite optical film includes an acrylate-based polymer matrix and the stable core-shell structured quantum dots uniformly dispersed in the polymer matrix.

According to one embodiment of the present invention, the polymer matrix may be an acrylate-based polymer selected from polymethyl acrylate, polyethyl acrylate, polybutyl acrylate, polymethyl methacrylate, polyethyl methacrylate, and polybutyl methacrylate.

According to another aspect of the present invention, a method for preparing the stable core-shell structured quantum dots includes (a) preparing a polymethyl methacrylate (PMMA)-RAFT polymerization macroinitiator, (b) preparing a poly(methyl methacrylate-b-glycidyl methacrylate)-RAFT (P(MMA-b-GMA)-RAFT) block copolymer, (c) introducing a thiol group into the terminal of the P(MMA-b-GMA)-RAFT block copolymer to prepare P(MMA-b-GMA)-SH, (d) subjecting oleic acid (OA)-bound quantum dots (QDs) to a ligand exchange reaction with the P(MMA-b-GMA)-SH to prepare P(MMA-b-GMA)-QDs, and (e) forming a cross-linked inner shell layer surrounding the quantum dots via cationic ring-opening polymerization of the PGMA blocks to encapsulate the quantum dots.

The quantum dots have a core-shell structure and the surface of the quantum dots is encapsulated with two layers consisting of a polyglycidyl methacrylate inner shell and a polymethyl methacrylate outer brush.

According to one embodiment of the present invention, the cationic ring-opening polymerization of the PGMA blocks is carried out in the presence of a Lewis acid catalyst at room temperature without the need for additional heat or light.

According to the present invention, the coating of the surface of the quantum dots with the polymer stabilizes the quantum dots and improves the durability and dispersibility of the quantum dot optical film, achieving markedly improved efficiency of photoluminescent quantum dot devices. Therefore, it is anticipated that the present invention will pave the way for practical use of quantum dots in a variety of light-emitting applications, particularly in high power light-emitting sources, to find commercial application in various fields, including displays, bioimaging, lightings, and photovoltaic cells.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
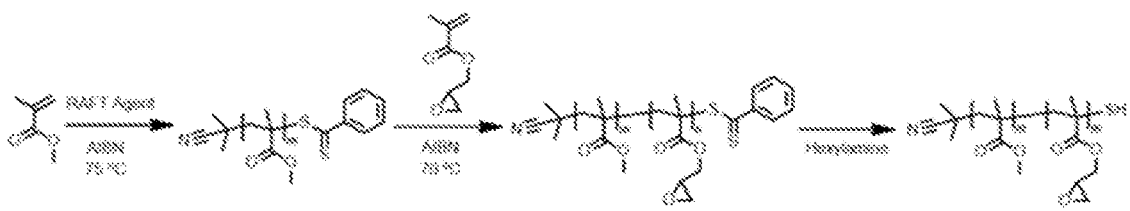
FIG. 1A shows a synthetic procedure for a P(MMA-b-GMA)-SH block copolymer ligand by RAFT polymerization and FIG. 1B shows schematics of a functional block copolymer ligand containing a cross-linkable PGMA block (top) and ligand exchange and shell cross-linking processes (bottom)

The present invention will be explained in more detail with reference to the following examples, including experimental examples. These examples are provided for illustrative purposes and do not serve to limit the scope of the invention.

Functional polymeric ligands, each of which is a block copolymer consisting of a cross-linkable monomer block and a general monomer block, were synthesized via reversible addition-fragmentation chain transfer polymerization and were mixed with quantum dots to modify the surface of the quantum dots. Thereafter, a suitable Lewis acid catalyst was added to cross-link one of the blocks of the polymeric ligand. As a result of the cross-linking, the surface of the quantum dots was encapsulated to prepare stable core-shell structured quantum dots.

The stabilities of the stable core-shell structured quantum dots under harsh conditions such as heat and oxidants were investigated. The stable quantum dots were dispersed in an acrylate-based polymer matrix to fabricate quantum dot optical films. The optical films were demonstrated for dispersibility and stability.

EXAMPLES (1) Toluene, tetrahydrofuran (THF), methyl isobutyl ketone (MIBK), methanol, n-hexane, methyl methacrylate (MMA), glycidyl methacrylate (GMA), 2-cyano-2-propyl benzodithioate (CPBD), 2,2'-azobisbutyronitrille (AIBN), hexylamine, and tris(pentafluorophenyl)borane were all purchased from Sigma-Aldrich. The PMMA homopolymer for QD-nanocomposite films ($M_n$=60,000 g/mol, PDI=1.11) was purchased from Polymer Source.

Indium acetate (In(acet)$_3$, 99.995%, metal basis), palmitic acid (PA, 99%), 1-octadecene (ODE, 90%), zinc acetate (Zn(acet)$_2$, 99.995%), oleic acid (OA, 99%), tri-n-octylphosphine (TOP, 99%), Se (99.99%, powder), S (99.998%, powder), and trioctylamine (TOA, 99%) were purchased from UniAm. Cadmium oxide (CdO, ≥99.99%), 1-dodecanethiol (DDT, ≥98%), zinc chloride (ZnCl$_2$, ≥99.995% anhydrous), and myristic acid (MA, ≥99%) were purchased from Sigma-Aldrich. Tris(trimethylsilyl)phosphine ((TMS)$_3$P, 99%) was purchased from SK chemicals. All anhydrous organic solvents were purchased from Daejung (Korea). All chemicals were used as received without further purification.

(2) Preparation of Precursors

Stock precursor solutions (0.5 M cadmium oleate [Cd(OA)$_2$] in 1-octadecene (ODE); 0.5 M zinc oleate [Zn(OA)$_2$] in ODE; 0.5 M indium palmitate [In(PA)$_3$]; 2 M selenium in tri-n-octylphosphine (TOPSe), and 2 M sulfur in TOP (TOPS)) were prepared, and each was stored under an Ar atmosphere before use.

(3) Synthesis of CdSe/ZnCdS Core/Shell Quantum Dots

CdSe/ZnCdS core/shell quantum dots were synthesized according to a previously known synthetic procedure. All quantum dot syntheses were performed via the Schlenk line technique.

A. CdO (1 mmol), MA (3 mmol), and ODE (15 mL) were mixed in a 3-neck flask and heated to 240° C. under inert conditions to form the Cd(MA)$_2$ complex. After the reactants turned transparent, TOPSe stock solution (0.25 mL) was quickly injected into the reaction flask to form a CdSe core (radius=2 nm).

B. After 3 min at 270° C., 3 mL of Zn(OA)$_2$ stock solution (1.5 mmol) and DDT (1 mmol) were sequentially injected to form a 0.5 nm thick Cd$_{0.6}$Zn$_{0.4}$S inner shell. The reaction preceded for 30 min, and Cd(OA)$_2$ (2 mL), Zn(OA)$_2$ (4 mL), and TOPS (1.5 mL) were added separately into the flask within 1 min for the formation of a 3 nm thick Cd$_{0.5}$Zn$_{0.55}$ outer shell. This reaction proceeded for 10 min. The final products were purified several times by the precipitation/redispersion method and dispersed in toluene for further use.

(4) Synthesis of InP/ZnSeS Core/Shell QDs

A. In(PA)$_3$ (0.5 mmol) and ODE (10 mL) were loaded in a 3-neck flask and heated to 110° C. under vacuum. After backfilling with Ar, the reaction flask was heated to 270° C. A mixed solution of (TMS)$_3$P (0.25 mmol) and TOP (2.5 mmol) was rapidly injected into the reaction flask to form nuclei. The reaction temperature was maintained for 20 min at elevated temperature and cooled to complete the reaction. The resultant InP core quantum dots were purified via the precipitation (acetone)/redispersion (toluene) method. Final InP quantum dots were dispersed in toluene (100 mg/mL) and kept in a refrigerator for further reaction.

B. For ZnSe and ZnS shell growth, Zn(OA)$_2$ (1.5 mL) and ODE (10 mL) were loaded in a 3-neck flask and heated to 110° C. under vacuum. After backfilling with Ar, 0.1 mL of InP QD solution was slowly added into the reaction flask and heated to 300° C. At elevated temperatures, the desired amount of TOPSe precursor was injected into the reaction flask for the growth of the ZnSe shell. After 30 min of reaction, the desired amounts of Zn(OA)$_2$ and TOPS were injected separately into the reaction flask to grow the ZnS shell, and the reaction preceded for 1 h at 310° C. The resultant quantum dots were purified twice by the precipitation/redispersion method and dispersed in toluene.

(5) Synthesis of P(MMA-b-GMA)-SH by RAFT polymerization

Thiol-terminated cross-linkable polymeric ligands were synthesized via reversible addition-fragmentation chain transfer polymerization.

A. First, MMA (5 g, 49.94 mmol), CPBD (0.096 g, 0.43 mmol), and AIBN (0.071 g, 0.043 mmol) were mixed in a Schlenk flask and degassed by argon purging. The polymerization was carried out at 75° C. for 24 h, and the reaction mixture was poured into cold methanol, yielding pink-colored powder of PMMA-RAFT macroinitiator. The molecular weight ($M_n$) and polydispersity index (PDI) were 9,300 g/mol and 1.23, respectively.

B. Second, to add PGMA block, PMMA-RAFT macroinitiator (3 g, 0.32 mmol) was mixed with GMA (1.6 g, 11.26 mmol) and AIBN (0.0053 g, 0.032 mmol) and polymerized at 70° C. for 6 h. Then, the reaction mixture was poured into cold methanol to obtain P(MMA-b-GMA)-RAFT block copolymer as a pink powder. The $M_n$ and PDI of the block copolymer were 12,100 g/mol and 1.21, respectively.

C. Finally, a terminal anchoring thiol group (—SH) was prepared by nucleophilic substitution of the RAFT end group with hexylamine (4 equivalents in anhydrous THF). The mixture was stirred overnight until the solution color turned pink to pale yellow, precipitated in cold methanol and dried in vacuo to produce P(MMA-b-GMA)-SH as a white powder.

(6) Ligand Exchange

Substitution of pristine OA ligands to polymeric ligands was performed in a single-phase reaction. 10 mg of QDs dissolved in 2 mL toluene was mixed with 40 mg of P(MMA-b-GMA)-SH dissolved in 3 ml of toluene. The ligand exchange reaction was carried out for 48 h and terminated by precipitating the resulting polymer-grafted quantum dots (P(MMA-b-GMA)-QDs) with excess cold n-hexane. Afterward, sediments were redispersed with toluene, and precipitation-redispersion cycles were repeated 3 times to remove unbound polymeric or OA ligands (1 mg/mL in MIBK).

(7) Encapsulation Procedure by Cross-Linking of PGMA Blocks

For the formation of a cross-linked layer surrounding QDs via cationic ring-opening polymerization of the PGMA blocks, purified P(MMA-b-GMA)-QDs were dissolved in MIBK, and then, tris(pentafluorophenyl)borane was added (4 equivalent to the total calculated amount of epoxy groups in PGMA) to initiate polymerization of epoxy groups on the PGMA blocks. The reaction flask was kept for 24 h to complete the cross-linking reaction. The resultant products were then precipitated with excess n-hexane and redispersed in toluene.

(8) Preparation of QD-PMMA Nanocomposite Thin Films

Glass substrates were cleaned sequentially with acetone, methanol, and isopropyl alcohol by sonication for 15 min before use. The composite solution was prepared by dissolving QDs and PMMA homopolymer in toluene (0.5 wt % and 1 wt %, respectively). Then, thin films were fabricated by spin casting at 4000 rpm Films for top-view TEM were prepared by floating on the surface of a buffered oxide etch (BOE) solution and transferred to TEM grids. Thin cross-sectional sample (ca. 100 nm thick) was obtained by focused ion beam (FIB) milling.

(9) Characterization of the Polymeric Ligand

Characterization of the polymeric ligand was performed by gel permeation chromatography (GPC) and nuclear magnetic resonance (NMR). Waters GPC with THF as the eluent was used, and calculation of $M_n$ was performed by calibration with linear PS standards. To monitor the ligand exchange, the hydrodynamic diameters of the QDs were measured by dynamic light scattering (DLS) using BI-200SM (Brookhaven Instruments Corporation) with a 616 nm laser. Samples were diluted with toluene at room temperature. For optical characterization, absorption and emission spectra were obtained with a V-670 UV-visible/NIR spectrometer (Jasco Corporation) and Fluoromax-4 spectrometer (Horiba Scientific).

The PL quantum yields (QYs) of the solutions were calculated by comparing the fluorescence intensity of the solutions with the fluorescence intensity of CdS/CdSe/CdS spherical quantum wells (radius 5.1 nm, absolute PL QY=90%) solution, and all measurements were carried out at the same optical densities (OD=0.1) at an excitation wavelength of 450 nm. The morphologies of quantum dots in the PMMA matrix were examined by transmission electron microscopy (TEM) operating at 200 kV (Tecnai 20 electron microscope). Time-resolved PL experiments were carried out by using a time-correlated single-photon counting (TCSPC) method. The samples in solutions or films were excited by a 520 nm pulse (LDH-P-C-520, Picoquant). The time-resolved PL signals emitted from the samples were spectrally resolved by a monochromator and finally detected by a photomultiplier tube (PMT). The instrumental function of the time-resolved PL experimental setup is approximately 0.2 ns.

Experimental Examples and Results

A. As illustrated in FIG. 1A, P(MMA-b-GMA)-SH ligands with $M_n$ values of 9.3 kg/mol (PMMA) and 2.8 kg/mol (PGMA) were synthesized via RAFT polymerization.

The PMMA brush was chosen owing to its good optical transparency along with its high solubility in most organic solvents that allows the practical use of corresponding nanocomposites in a range of optical films fabricated by solution processing. The PGMA block covering the periphery of the QD was designed to improve the thermal stability via the formation of cross-linked networks, given that this polymeric network structure can effectively block the formation of surface oxidation.

The resulting P(MMA-b-GMA)-SH polymeric ligands were then mixed with the pristine quantum dot dispersion to undergo ligand exchange.

Figure 1B:
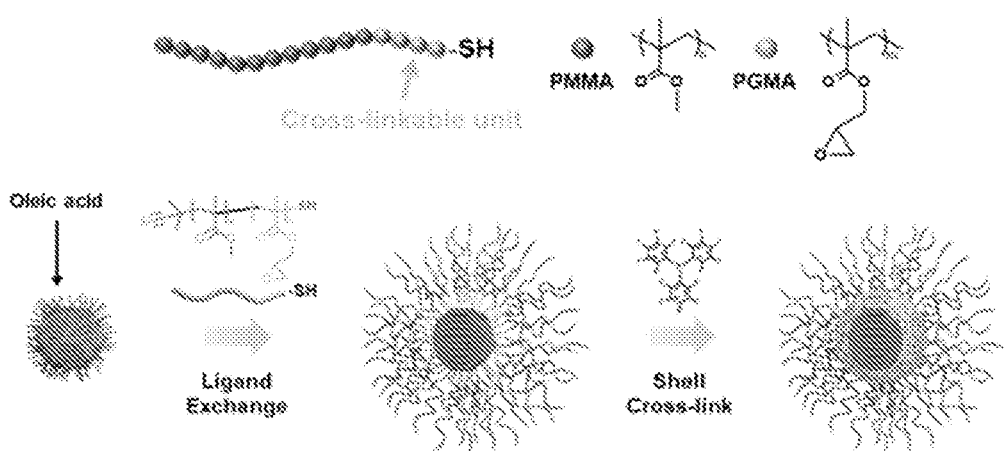

As monitored by dynamic light scattering (DLS), the hydrodynamic diameters of the CdSe/ZnCdS (or InP/ZnSeS) quantum dots (QDs) increase significantly from 13.5 (7.8) nm to 27.1 (21.0) nm after the ligand exchange process, indicating that the long polymeric ligands effectively replace short native oleic acid (OA) ligands in QDs. Since the thiol end group in the ligand is tethered on the surface of the QDs, the resulting core-shell structured quantum dots (QDs) are encapsulated with two distinctive layers consisting of a PGMA inner shell and PMMA outer brush (FIG. 1B).

B. As shown in FIGS. 2A-2D, normalized UV-vis absorbance (dashed lines) and photoluminescence (PL) spectra (bold lines) of (2A) CdSe/ZnCdS QDs and (2B) InP/ZnSeS QDs (pristine QDs capped with OA (bottom), QDs tethered with P(MMA-b-GMA)-SH (middle), and the inventive PGMA cross-linked P(MMA-b-XGMA)-QDs (top) encapsulated with two distinctive layers consisting of a PGMA inner shell and PMMA outer brush. UV-vis and PL spectra are vertically shifted for visual clarity (insets correspond to TEM images of respective QDs. The scale bars are 20 nm).

Figure 2A:
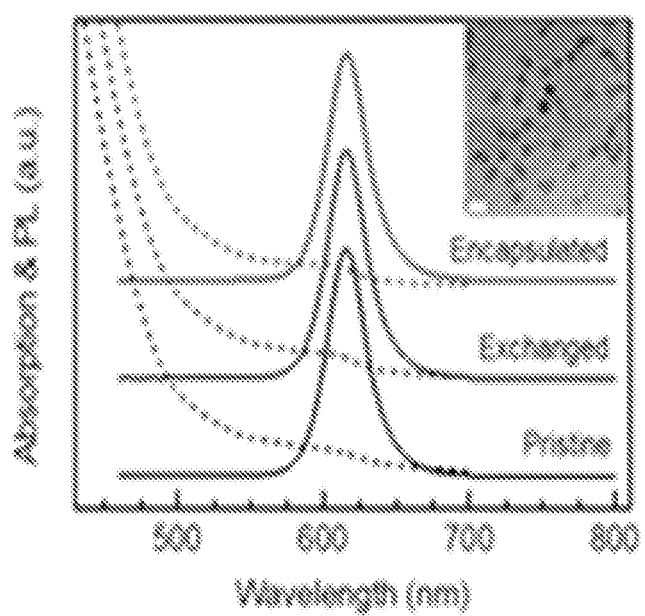
FIGS. 2A to 2C show the optical characteristics of CdSe/ZnCdS and InP/ZnSeS quantum dots during ligand exchange and cross-linking reactions.
Figure 2B:
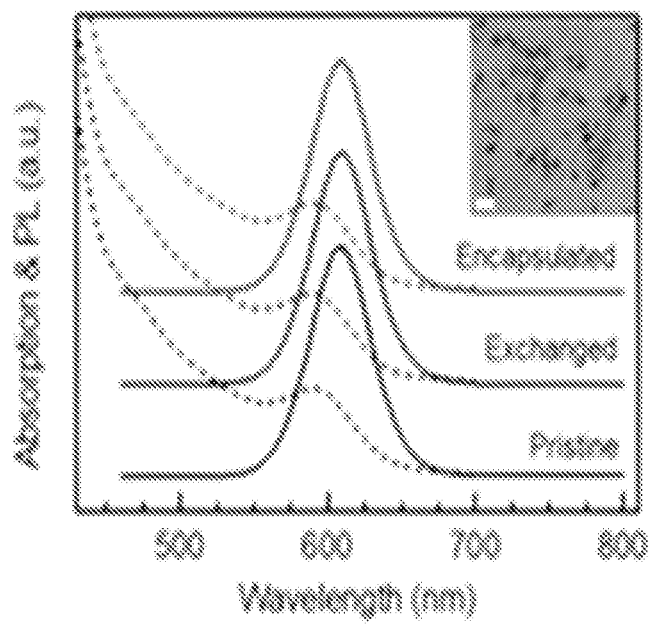
Figure 2C:
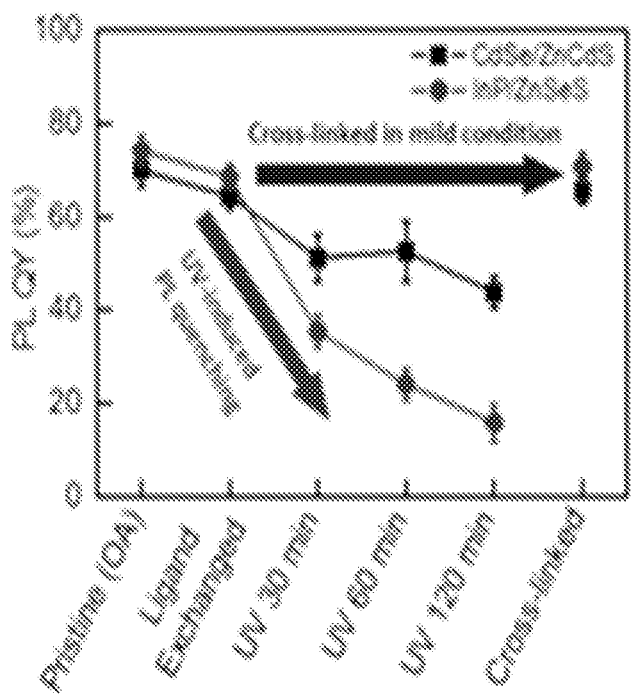
Figure 3A:
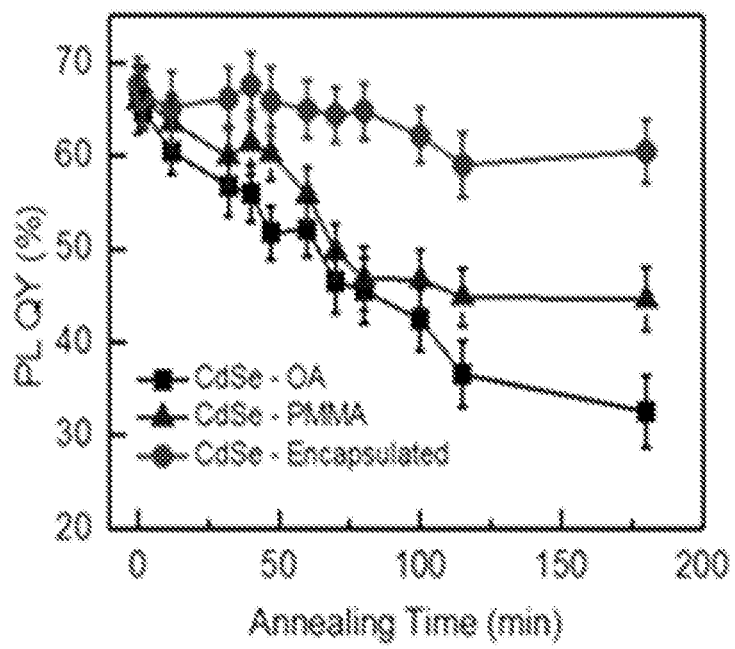
FIGS. 3A and 3B show the PL QY of QDs as a function of thermal exposure time (100° C., in toluene): CdSe/ZnCdS QDs (3A) and InP/ZnSeS QDs (3B) capped with OA (squares), PMMA (triangles), and shell-cross-linked P(MMA-b-GMA) (circles)
Figure 3B:
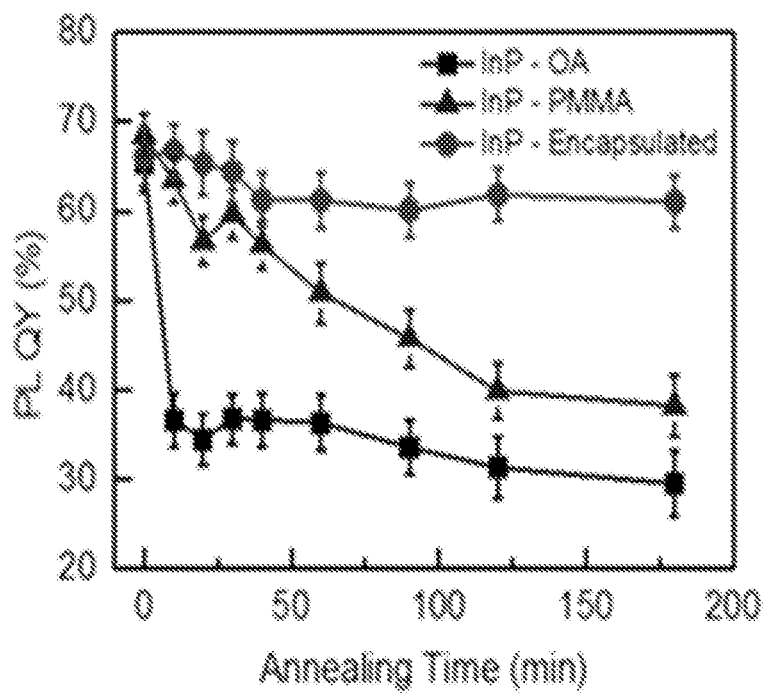

FIG. 2C shows PL QY traces of CdSe/ZnCdS QDs (squares) and InP/ZnSeS QDs (circles) tethered with the same P(MMA-b-GMA)-SH ligands but cross-linked with different methods. The PL QYs of QDs decrease under the UV cross-linking process (noted by black lines), whereas the PL QYs of QDs remain unchanged during cross-linking via cationic ring-opening polymerization of epoxides.

C. To obtain an effective cross-linked network around QDs, at least two prerequisites need to be satisfied: high areal density (i.e., enough surface coverage) of polymer ligands on the QD surface and mild cross-linking reaction conditions to avoid unwanted side reactions on the QD surface that could affect the photophysical properties of QDs.

Thermal gravitational analysis reveals that the areal chain density of polymer ligands after the ligand exchange process is 1 chains/nm$^2$, which is sufficient for subsequent cross-linking of the PGMA block.

To avoid undesirable physical or chemical side effects on the quantum dot surface, the present inventors employed the cationic ring-opening polymerization of epoxides with a Lewis acid catalyst, tris(pentafluorophenyl)borane, under ambient conditions for cross-linking and corresponding encapsulation of the QDs.

As seen FIGS. 2A and 2B, the optical spectra of the CdSe/ZnCdS and InP/ZnSeS quantum dots (QDs) barely change after both ligand exchange and shell cross-linking by cationic ring-opening polymerization, implying that the photophysical properties of the QDs remain intact throughout the entire QD encapsulation process. A slight decrease (5%) in the PL QY during the ligand exchange step is attributed to the formation of hole trap sites on the QD surface during the ligand exchange process. It should be highlighted that the PL QYs of QDs are highly dependent on the PGMA cross-linking method (FIG. 2C).

In contrast to the mild reaction conditions for the cross-linking of PGMA using a Lewis acid catalyst (indicated with a blue arrow), the traditional UV cross-linking method brings about a significant drop in the PL QYs of QDs (indicated with a black arrow) regardless of the QD type.

D. To examine the thermal stabilities of QDs, QDs capped with OA, PMMA homopolymer ($M_n$=12,000 g/mol), and cross-linked P(MMA-b-GMA) (denoted as P(MMA-b-XGMA)) were dispersed in toluene and annealed at 100° C. for various times (FIGS. 3A to 3D). In contrast to OA-QDs and PMMA-QDs, which show a gradual PL QY decrease, P(MMA-b-XGMA)-QDs maintain their PL QY even at elevated temperatures, clearly reflecting that the cross-linked inner shell dramatically improves the thermal stability of QDs.

Under high temperature in the presence of oxygen, sulfur atoms ($S^{2-}$) on the surface are liable to be oxidized into forms of $SO_x^-$ and leave behind uncompensated zinc atoms on the surface that serve as electron charge trap sites. The increase in the surface trap densities escalates the nonradiative recombination channels, thereby leading to the reduction of PL QY in QDs. Ligand dissociation also presumably contributes to PL quenching following a similar mechanism, given that bonding between cation atoms on the quantum dot surface (Zn, Cd) and thiol ($S^-$) is unstable at elevated temperature.

The cross-linked shell structure can effectively suppress the dissociation process of thiol-terminated ligands. Furthermore, the cross-linked polymer shell acts as an insulating layer between the quantum dot surface and outer environments and hence hinders chemical oxidation of surface atoms. From these two synergetic effects, the inventive encapsulated QDs maintain a PL QY over 85% of their initial values even after 3 h of annealing at elevated temperatures.

E. The enhanced stability of P(MMA-b-XGMA)-QDs against oxidation was further confirmed by direct exposure of quantum dot solutions to ambient air or oxidative etchant (i.e., hydrogen peroxide, $H_2O_2$).

Figure 4A:
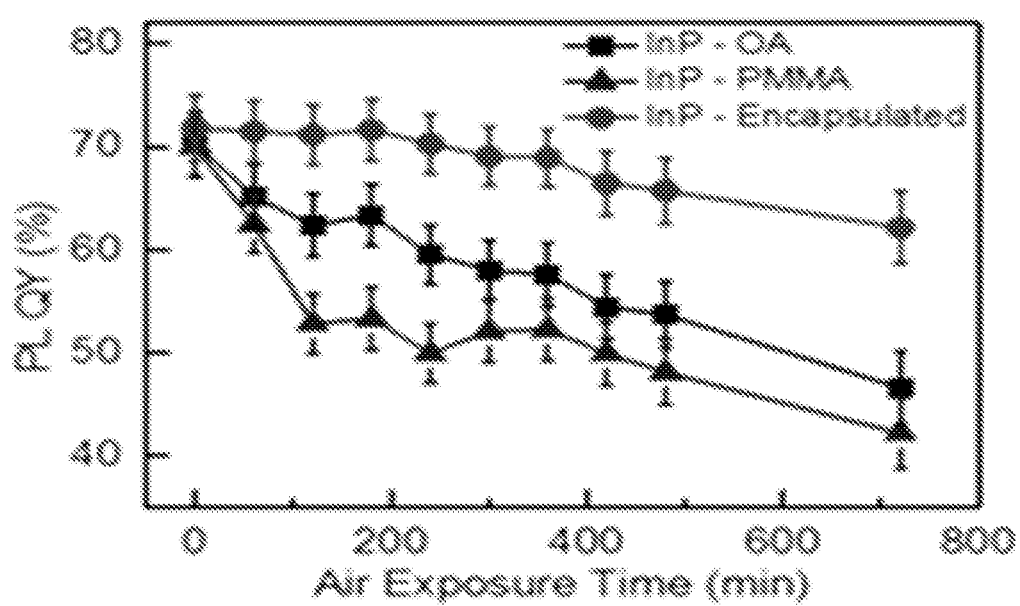
FIGS. 4A to 4D show the chemical and air stabilities of OA-QDs (squares), PMMA-QDs (triangles), and P(MMA-b-XGMA)-QDs (circles): PL QY traces of InP/ZnSeS quantum dots upon exposure to ambient air (4A) and CdSe/ ZnCdS quantum dots exposed to oxidative etching conditions by the addition of 40 mM $H_2O_2$ (4B), PL peak shift of CdSe/ZnCdS quantum dots upon exposure to $H_2O_2$ (4C), and XPS spectra of CdSe/ZnCdS quantum dots capped with OA ligands (top) and P(MMA-b-XGMA)-SH ligands (bottom) after exposure to $H_2O_2$ for 2 h (4D)

As seen in FIG. 4A, P(MMA-b-XGMA)-QDs exhibit greater robustness over OA-QDs or PMMA-QDs (InP/ZnSeS QDs) under exposure to air. The decrease in the PL of the OA-QDs and PMMA-QDs is attributed to reactive oxygen species in the atmosphere that undergo oxidation. Although a densely cross-linked polymeric network around QDs cannot perfectly block small gaseous species such as $O_2$, it is assumed that encapsulation can reduce the probability of oxidation to some extent by screening vulnerable QD surfaces and emissive cores.

Figure 4B:
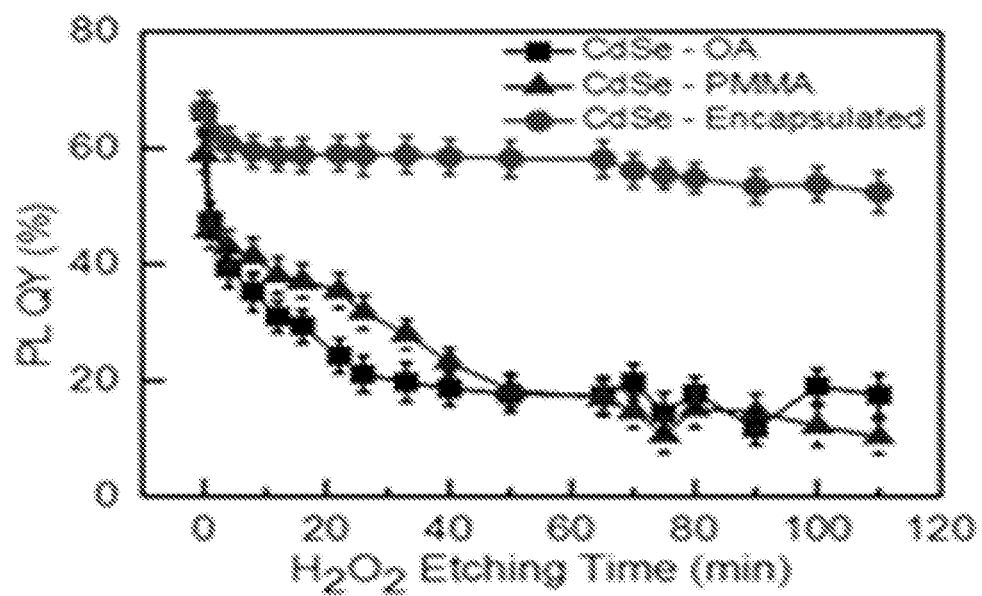
Figure 4C:
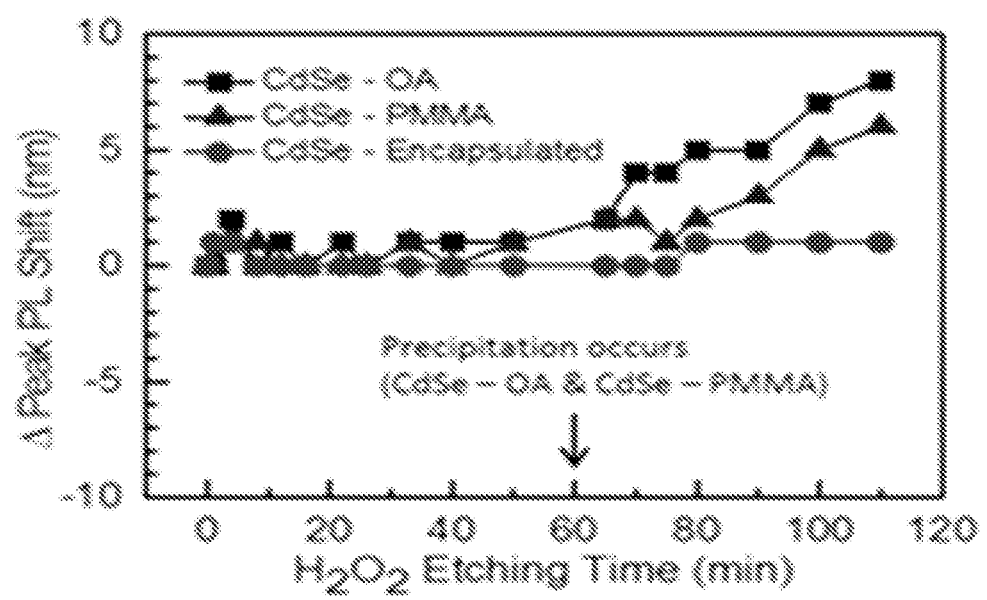
Figure 4D:
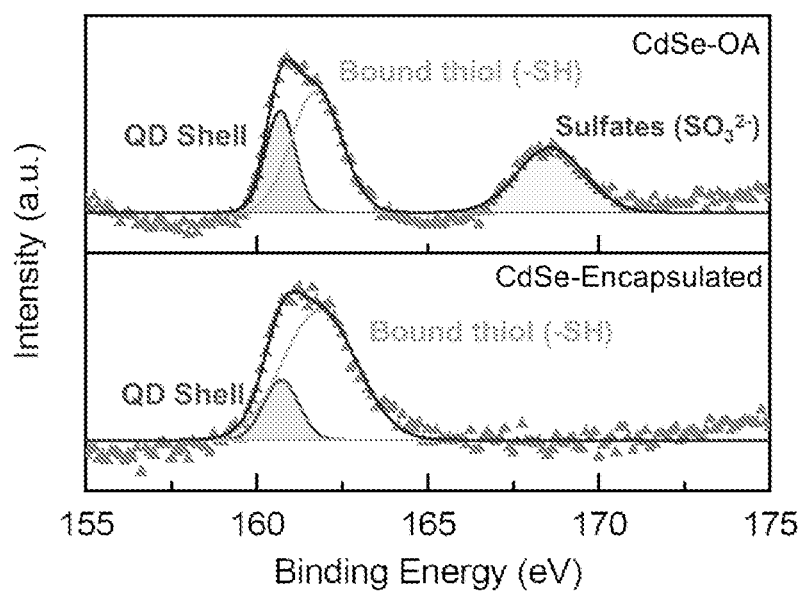

In addition, since CdSe/ZnCdS QDs possess a thicker shell (3.5 nm) than InP/ZnSeS QDs (1.9 nm), their stabilities against oxidation were investigated under harsher conditions by direct exposure to $H_2O_2$ (FIG. 4B). The addition of 40 mM $H_2O_2$ into the QD dispersion promptly yields a dramatic decrease in the PL QY of OA-QDs and PMMA-QDs. The QDs eventually aggregate and precipitate after ~1 h of etching. Moreover, their PL peak redshifted, as shown in FIG. 4C. In contrast, the encapsulated CdSe/ZnCdS QDs did not exhibit any notable aggregation or redshift of the PL peak even after etching with $H_2O_2$, owing to the protective cross-linked shell on the QD surface. To monitor the effect of the protective shell against oxidation, the surface of the CdSe/ZnCdS QDs after 2 h of $H_2O_2$ etching was investigated by X-ray photoelectron spectroscopy (XPS). The S 2p peak in FIG. 4D shows the coexistence of the peaks from the shell of QDs (160.7 eV) and from the bound thiol (161.8 eV). The sulfate peak (168.6 eV) as a result of sulfur oxidation observed in the OA-capped QDs (top) was absent in the case of shell cross-linked CdSe/ZnCdS QDs (bottom), clearly indicating that the protective shell also effectively retards oxidation processes.

F. Homogeneous distribution of QDs in the matrix is a critical and basic requirement for solution-based device-fabrication processes, since massive aggregation of QDs causes poor reproducibility of the product, such as high haze and position-dependent optical quality. In addition, a close interparticle distance due to the aggregation of QDs promotes exciton transfer among QDs, which escalates the probability for photoexcited excitons to undergo nonradiative recombination processes.

To demonstrate the dispersion quality of the QDs in PMMA, composite films with OA-QDs and P(MMA-b-XGMA)-QDs were prepared and characterized by TEM.

Figure 5A:
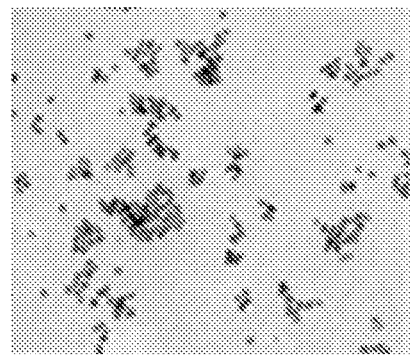
FIGS. 5A to 5L show top-view (5A-5D) and cross-sectional (5E-5H) TEM images and AFM height profiles (5×5 μm) (5I-5L) of QD-PMMA nanocomposite films containing CdSe/ZnCdS quantum dots capped by 5A, 5E, 5I OA and 5B, 5F, 5J P(MMA-b-XGMA)-SH ligands, and InP/ZnSeS QDs capped by 5C, 5G, 5K OA and 5D, 5H, 5L P(MMA-b-XGMA)-SH ligands: the scale bars in 5A-5D and 5E-5H are 200 nm and 100 nm, respectively, and the $S_q$ values in 5I-5L represent the root mean square height, corresponding to the surface roughness of films.
Figure 5B:
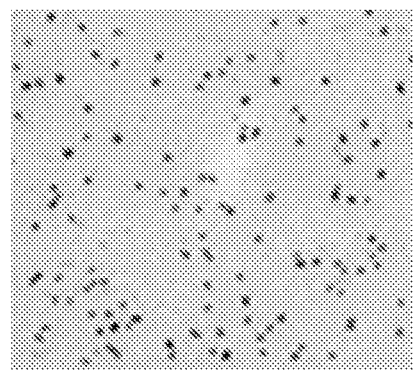
Figure 5C:
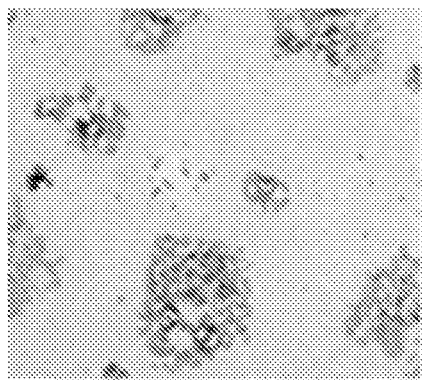
Figure 5D:
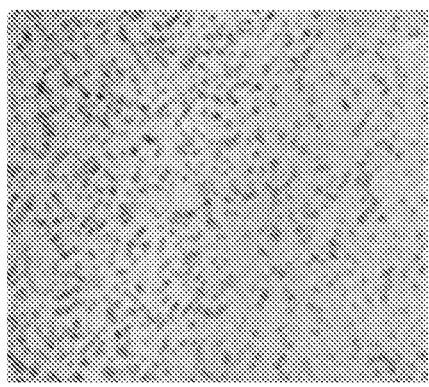
Figure 5E:
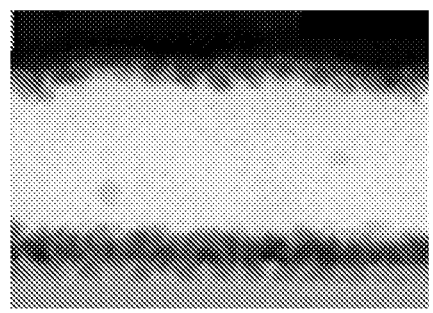
Figure 5F:
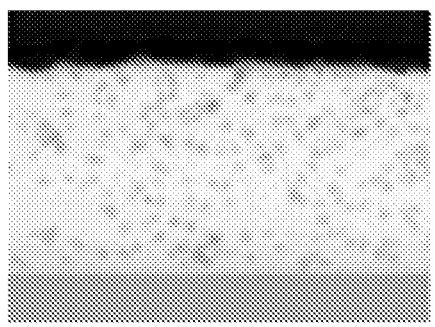
Figure 5G:
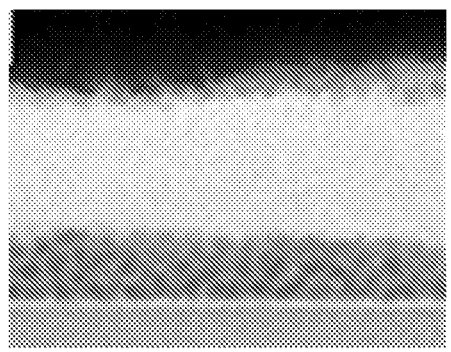
Figure 5H:
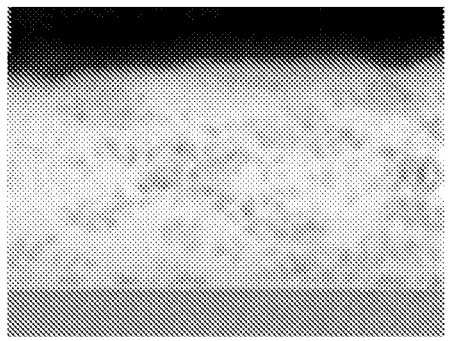
Figure 5I:
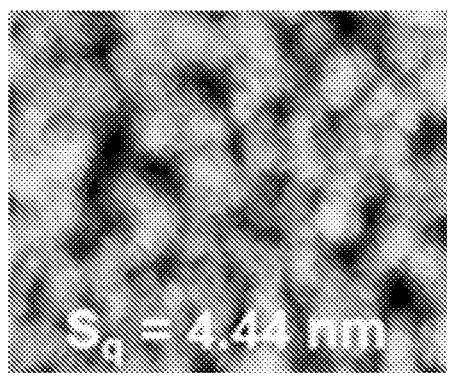
Figure 5J:
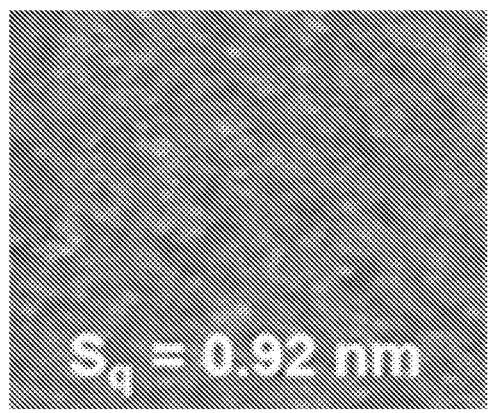
Figure 5K:
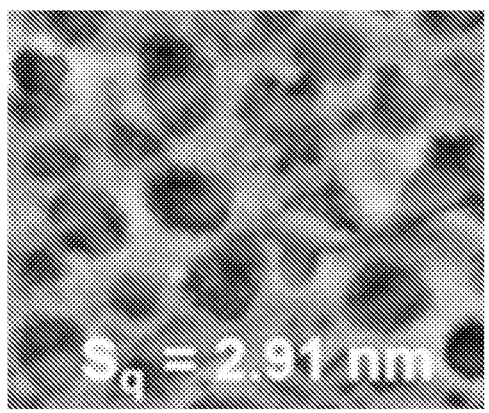
Figure 5L:
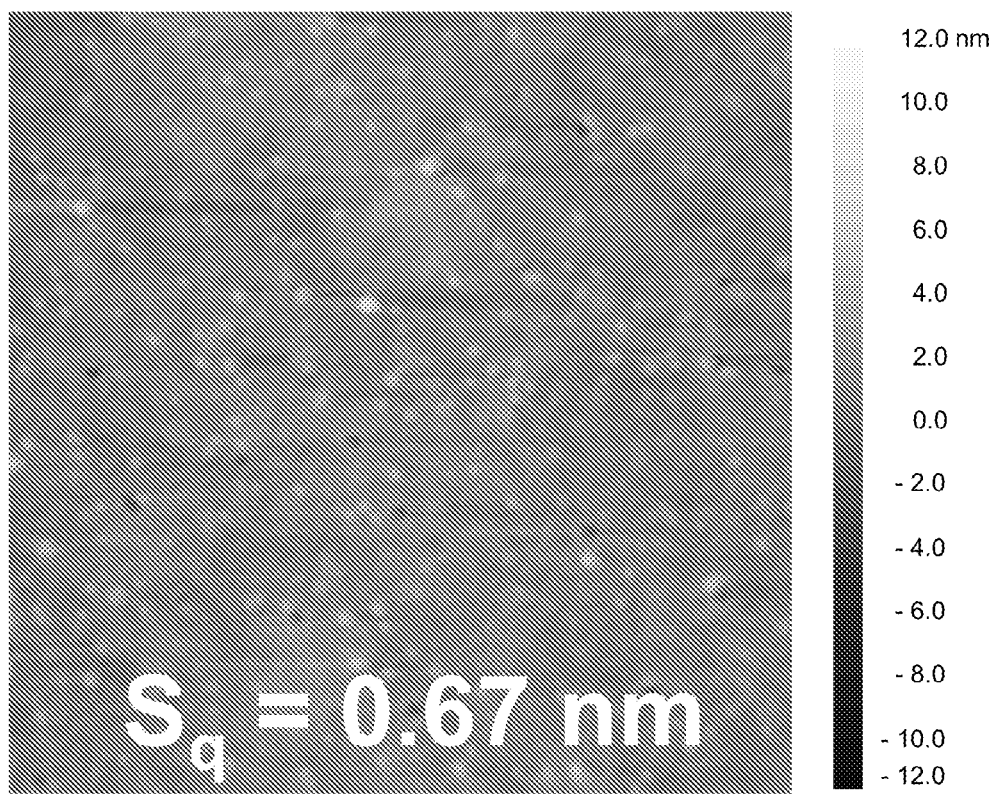
Figure 6A:
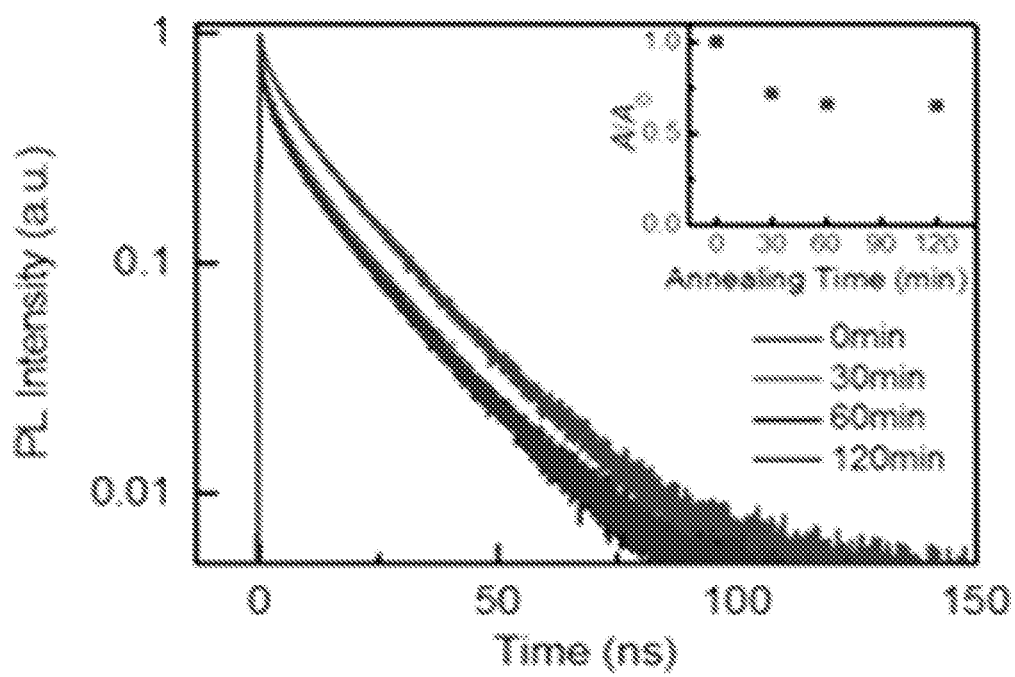
FIGS. 6A-6D shows PL spectra of QD-nanocomposite films at various annealing times at 100° C.: PL decay dynamics CdSe/ZnCdS QDs capped with (6A) OA ligands and (6B) P(MMA-b-XGMA)-SH ligands and InP/ZnSeS QDs capped with (6C) OA and (6D) P(MMA-b-XGMA)-SH ligands.
Figure 6B:
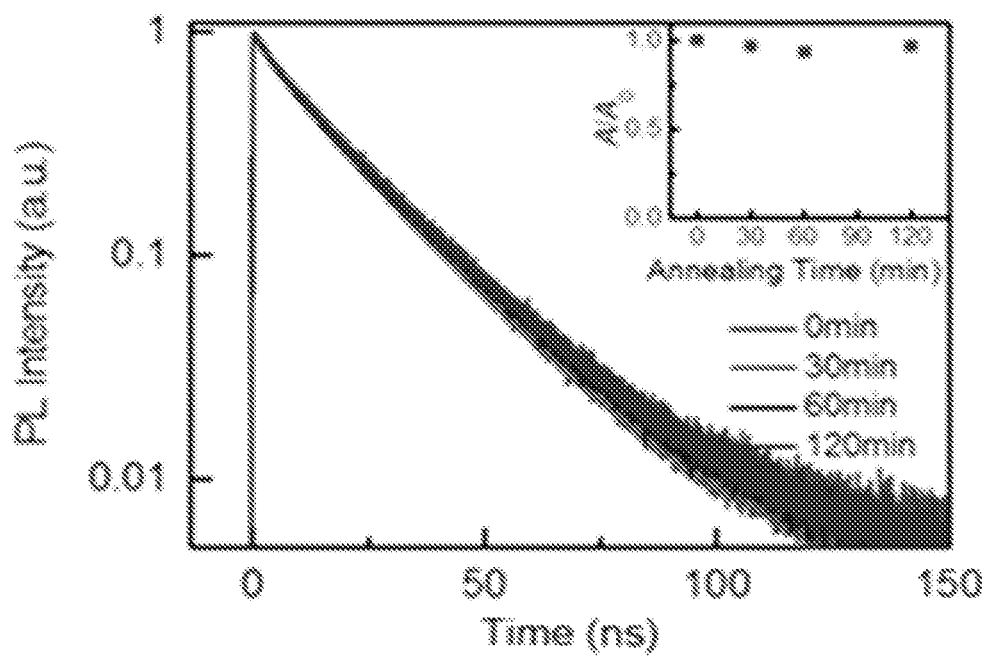
Figure 6C:
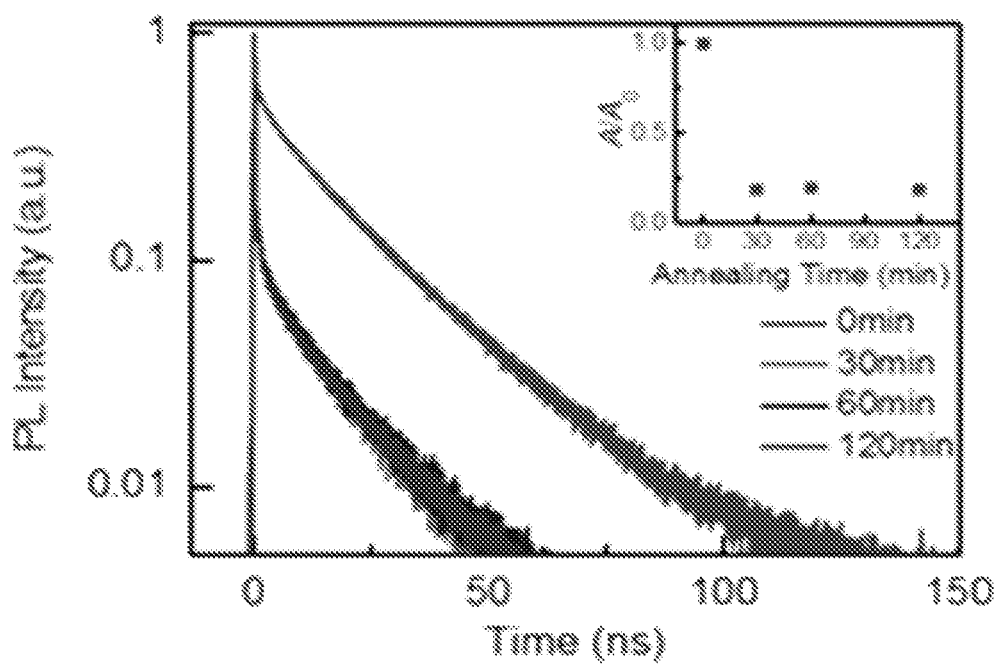
Figure 6D:
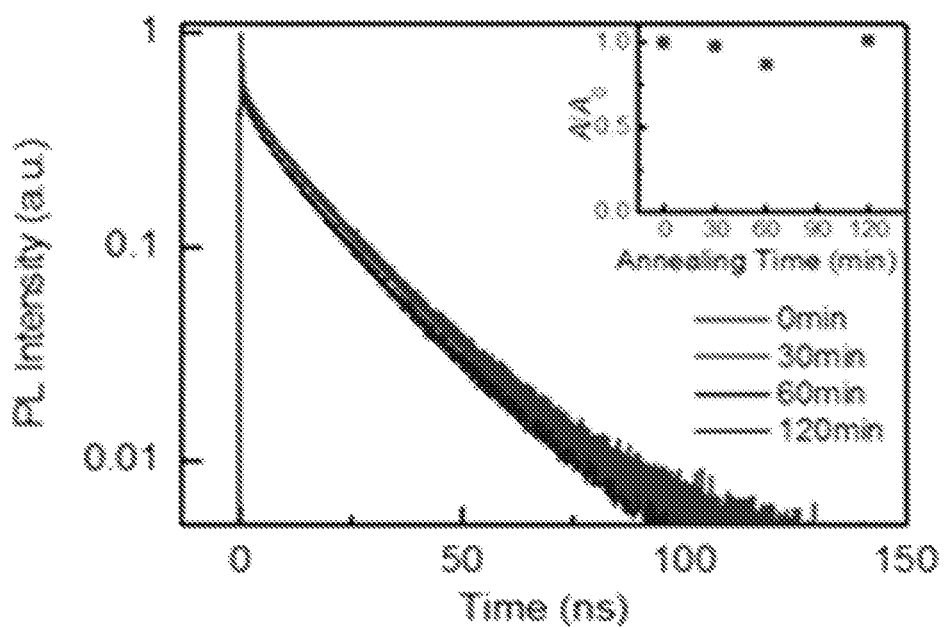

As shown in FIGS. 5A and 5C, OA-QDs are massively aggregated within the spin-cast PMMA film, mainly due to the immiscibility of PMMA and the aliphatic ligand. In contrast, the encapsulated QDs with the outer PMMA brush layer are well dispersed within the PMMA matrix without any aggregation (FIGS. 5B and 5D).

From the cross-sectional TEM images, it can be clearly seen that OA-QDs are segregated into the top surface and the bottom interface of films, whereas P(MMA-b-XGMA)-QDs are well distributed throughout the film thickness.

Furthermore, the surface morphologies of QD-nanocomposite films were investigated by AFM, as shown in FIGS. 5I-5L. The height profiles of OA-QD nanocomposite films (FIGS. 5I and 5K), where apparent structural instabilities were clearly observed, were first examined. The roughness on the PMMA film is mainly due to the aggregation of immiscible OA-QDs, possessing lower surface energy ($\gamma_{OA\text{-}air}$=32.1 mJ/m$^2$) than PMMA ($\gamma_{PMMA\text{-}air}$=41.1 mJ/m$^2$). However, smooth and homogeneous height profiles were obtained in the inventive P(MMA-b-XGMA)-QD nanocomposite films (FIGS. 5J and 5L), suggesting that these QDs are well distributed throughout the film thickness without surface segregation/aggregation, consistent with top-view and cross-sectional TEM images.

G. To evaluate the thermal stability of shell cross-linked QDs in the nanocomposite films, the photophysical properties of QDs in films were characterized with time-correlated single-photon counting (TCSPC) measurements (FIGS. 6A-6D).

A fast decay component appears for OA-QDs after thermal annealing at 100° C. (FIGS. 6A and 6C), representing the rise of fast nonradiative recombination processes under heat exposure. By contrast, the PL decay curves of the inventive P(MMA-b-XGMA)-QDs barely change upon thermal annealing regardless of QD type (FIGS. 6B and 6D), strongly suggesting that the photophysical properties of QD-nanocomposite films remain intact by cross-linked shells.

H. As discussed above, enhancing the stability of quantum dots (QDs) has been highly challenging, and many of the developed methods have intrinsic limitations or difficulties for application to final products such as optical devices. In the present invention, a cross-linkable polymeric ligand is introduced into QDs to form a protective shell on the QD surface. The cross-linking reaction is carried out under mild ambient conditions so that the original PL QY of QDs is not affected. Consequently, it is demonstrated that the stability of the shell cross-linked QDs is drastically improved and is sufficient to tolerate harsh external environments such as heat and chemical oxidation. This is a very simple yet efficient strategy to enhance the stability of QDs, which does not require any sophisticated manipulation of the intrinsic structure or geometry of QDs. Therefore, it is anticipated that the present invention will pave the way for practical use of QDs in a variety of light-emitting applications, particularly in high power light-emitting sources, to find commercial application in various fields, including displays, bioimaging, illumination, and photovoltaic cells.

What is claimed is:

1. Quantum dots comprising:
    core-shell structured quantum dots; and
    thiol-terminated polymeric ligands introduced on surfaces of the core-shell structured quantum dots to encapsulate the surfaces of the core-shell structured quantum dots,
    wherein the polymeric ligand is a block copolymer of methyl methacrylate and glycidyl methacrylate repeating units (poly(methyl methacrylate-b-glycidyl methacrylate)), and
    wherein the thiol-terminated polymeric ligands are cross-linked to the surfaces of the core-shell structured quantum dots.

2. The quantum dots according to claim 1, wherein the core-shell structured quantum dots are encapsulated with two layers consisting of a polyglycidyl methacrylate inner shell and a polymethyl methacrylate outer brush.

3. The quantum dots according to claim 1, wherein the core of the quantum dots is a binary compound selected from the group consisting of CdSe, CdTe, ZnS, ZnSe, ZnTe, ZnO, HgS, HgSe, HgTe, MgSe, and MgS, and the shell of the quantum dots is a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS.

4. The quantum dots according to claim 1, wherein the core of the quantum dots is a binary compound selected from the group cosisting of GaN, GaP, GaAs, GaSb, AlN, AlP, AlAs, AlSb, InN, InP, InAs, and InSb, and the shell of the quantum dots is a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS.

5. The quantum dots according to claim 1, wherein the quantum dots have a CdSe/ZnCdS or InP/ZnSeS core/shell structure.

6. A quantum dot-polymer composite optical film comprising a polymer matrix and the quantum dots according to claim 1 present in the polymer matrix.

7. The quantum dot-polymer composite optical film according to claim 6, wherein the polymer matrix is composed of an acrylate-based polymer selected from group consisting of polymethyl acrylate, polyethyl acrylate, polybutyl acrylate, polymethyl methacrylate, polyethyl methacrylate, and polybutyl methacrylate.

8. A method for preparing quantum dots, comprising:
(a) preparing a polymethyl methacrylate (PMMA)-RAFT polymerization macroinitiator,
(b) reacting a glycidyl methacrylate with the (PMMA)-RAFT polymerization macroinitiator to prepare a poly(methyl methacrylate-b-glycidyl methacrylate)-RAFT (P(MMA-b-GMA)-RAFT) block copolymer,
(c) introducing a thiol group into the terminal of the P(MMA-b-GMA)-RAFT block copolymer to prepare P(MMA-b-GMA)-SH,
(d) subjecting oleic acid (OA)-bound quantum dots (QDs) to a ligand exchange reaction with the P(MMA-b-GMA)-SH to prepare P(MMA-b-GMA)-QDs, and
(e) forming a cross-linked inner shell layer surrounding the quantum dots via cationic ring-opening polymerization of the PGMA blocks to encapsulate the quantum dots wherein the quantum dots have a core-shell structure and the surface of the quantum dots is encapsulated with two layers consisting of a polyglycidyl methacrylate inner shell and a polymethyl methacrylate outer brush.

9. The method according to claim 8, wherein the cationic ring-opening polymerization of the PGMA blocks is carried out in the presence of a Lewis acid catalyst at room temperature.

* * * * *